United States Patent
Tanoue et al.

(10) Patent No.: US 11,922,912 B2
(45) Date of Patent: Mar. 5, 2024

(54) INSTRUMENT PLAYING APPARATUS

(71) Applicant: YAMAHA CORPORATION, Hamamatsu (JP)

(72) Inventors: Michiko Tanoue, Hamamatsu (JP); Fukutaro Okuyama, Hamamatsu (JP)

(73) Assignee: YAMAHA CORPORATION, Hamamatsu (JP)

( * ) Notice: Subject to any disclaimer, the term of this patent is extended or adjusted under 35 U.S.C. 154(b) by 672 days.

(21) Appl. No.: 17/087,951

(22) Filed: Nov. 3, 2020

(65) Prior Publication Data

US 2021/0151020 A1    May 20, 2021

(30) Foreign Application Priority Data

Nov. 20, 2019 (JP) ................. 2019-209632

(51) Int. Cl.
- *G10H 1/34* (2006.01)
- *G01D 5/16* (2006.01)
- *G01D 5/20* (2006.01)
- *G10H 3/10* (2006.01)

(52) U.S. Cl.
CPC ............ *G10H 1/346* (2013.01); *G01D 5/16* (2013.01); *G01D 5/2006* (2013.01); *G10H 3/10* (2013.01); *G10H 2220/221* (2013.01); *G10H 2220/461* (2013.01)

(58) Field of Classification Search
CPC .... G10H 1/346; G10H 3/10; G10H 2220/221; G10H 2220/461; G01D 5/16; G01D 5/2006
USPC .......................................................... 84/733
See application file for complete search history.

(56) References Cited

U.S. PATENT DOCUMENTS

| | | | | |
|---|---|---|---|---|
| 3,139,476 A | * | 6/1964 | Alvarez | .................. G10D 3/00 84/217 |
| 3,215,765 A | * | 11/1965 | Miessner | ................ G10D 13/09 84/DIG. 21 |
| 3,708,605 A | * | 1/1973 | Ohno | .................. G10H 1/0555 984/319 |
| 3,749,806 A | * | 7/1973 | Rosenberg | ........... G10H 1/0555 984/319 |

(Continued)

FOREIGN PATENT DOCUMENTS

| | | |
|---|---|---|
| CN | 111512360 A | 8/2020 |
| JP | H0348295 A | 3/1991 |

(Continued)

OTHER PUBLICATIONS

Extended European Search Report issued in European Appln. No. 20207263.3 dated Mar. 26, 2021.

(Continued)

*Primary Examiner* — Christina M Schreiber

(74) *Attorney, Agent, or Firm* — ROSSI, KIMMS & McDOWELL LLP

(57) ABSTRACT

An instrument playing apparatus has: a movable member configured to be displaced responsive to a playing operation of a user; a detection part formed from a magnetic or conductive body and disposed on the movable member; and a filter that includes a coil. The filter has a frequency response that changes depending on a distance between the detection part and the coil, and generates a detection signal from a reference signal.

11 Claims, 8 Drawing Sheets

(56) References Cited

U.S. PATENT DOCUMENTS

| | | | | |
|---|---|---|---|---|
| 4,580,478 A * | 4/1986 | Brosh | ............ | G10H 1/0555 |
| | | | | 984/319 |
| 4,838,139 A * | 6/1989 | Fiori, Jr. | ............ | G10H 1/182 |
| | | | | 341/32 |
| 6,150,600 A * | 11/2000 | Buchla | ............ | G10H 1/0555 |
| | | | | 84/688 |
| 7,006,014 B1 * | 2/2006 | Henty | ............ | G06F 3/0231 |
| | | | | 341/20 |
| 10,482,861 B2 * | 11/2019 | Harimoto | ............ | H01H 13/85 |
| 10,720,131 B2 * | 7/2020 | Yamamoto | ............ | G10H 1/346 |
| 10,984,773 B2 * | 4/2021 | Glowka | ............ | G10D 13/08 |
| 2020/0320966 A1 * | 10/2020 | Clark | ............ | G10H 1/344 |
| 2021/0151020 A1 * | 5/2021 | Tanoue | ............ | G10H 1/346 |

FOREIGN PATENT DOCUMENTS

| | | | | | |
|---|---|---|---|---|---|
| JP | 2001175262 A | | 6/2001 | | |
| JP | 3678209 B2 * | | 8/2005 | ............ | G10H 1/0556 |
| JP | 2008064978 A * | | 3/2008 | ............ | G06F 3/016 |
| WO | 8705732 A1 | | 9/1987 | | |
| WO | WO-8705732 A1 * | | 9/1987 | | |
| WO | 2018173923 A1 | | 9/2018 | | |
| WO | 2019122867 A1 | | 6/2019 | | |
| WO | WO-2019122867 A1 * | | 6/2019 | ............ | G01D 5/2006 |
| WO | WO-2022176740 A1 * | | 8/2022 | | |

OTHER PUBLICATIONS

Office Action issued in European Appln. No. 20207263.3 dated Jan. 30, 2023.
Extended European search report issued in European Appln. No. 23180700.9, dated Jul. 18, 2023.
Office Action issued in Japanese Appln. No. 2019-209632, dated Aug. 8, 2023. English machine translation provided.
Office Action issued in Chinese Appln. No. 202011229004.9, dated Nov. 1, 2023. English machine translation provided.
Office Action issued in Japanese Appln. No. 2019-209632, dated Jan. 4, 2024. English machine translation provided.

* cited by examiner

INSTRUMENT PLAYING APPARATUS

CROSS-REFERENCE TO RELATED APPLICATION

This application is based on and claims priority from Japanese Patent Application No. 2019-209632, filed on Nov. 20, 2019, the entire contents of which are incorporated herein by reference.

BACKGROUND

Technical Field

The present disclosure relates to an instrument playing apparatus.

Background Information

A variety of techniques have been proposed for detecting displacement of a movable member such as a key of a musical keyboard instrument. Japanese Patent Application Laid-Open Publication No. H3-48295 (hereafter, JP H3-48295) discloses a configuration in which a coil disposed on a frame of a musical keyboard instrument and a metal plate disposed on a key each of the instrument are used to detect a position of each key of the instrument.

By this configuration, when a metal plate disposed on a key is displaced upon depression of the key, a current flow through the coil changes. A current flowing through the coil is monitored to generate a detection signal representative of a change in a key position.

The technique disclosed in JP H3-48295 is subject to a drawback, however, in that practically it is difficult to substantially change a current flowing through the coil responsive to displacement of a metal plate upon depression of a key. Accordingly, it is not practically possible to generate a detection signal that highly accurately represents a slight key displacement.

SUMMARY

In view of the circumstances described above, an object of one aspect of the present disclosure is to generate a detection signal that highly accurately represents a slight displacement of a movable member in an instrument playing apparatus.

To achieve the above-stated object, an instrument playing apparatus according to one aspect of the present disclosure has: a movable member configured to be displaced responsive to a playing operation of a user; a detection part formed from a magnetic or conductive body and disposed on the movable member; and a filter that includes a coil and is configured to generate a detection signal from a reference signal, the filter having a frequency response that changes depending on a distance between the detection part and the coil.

DETAILED DESCRIPTION

A: First Embodiment

Figure 1:
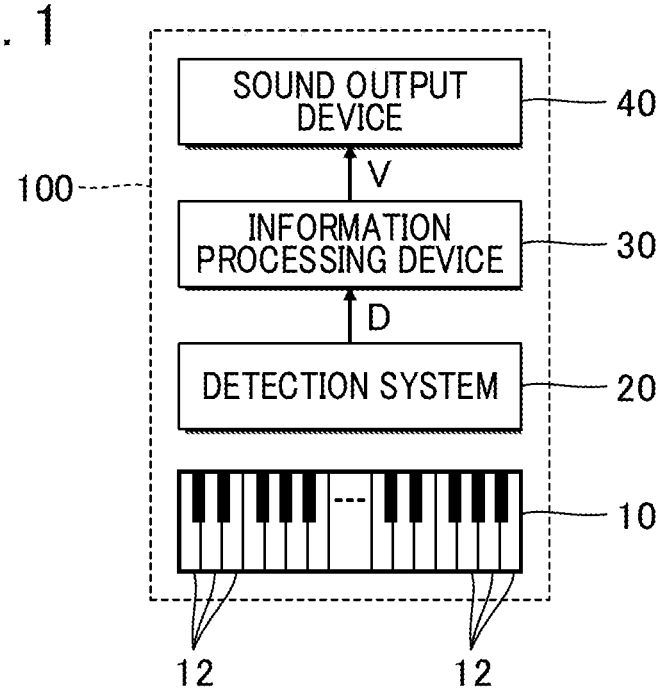
FIG. 1 is a block diagram showing a configuration of a musical keyboard instrument according to a first embodiment.

FIG. 1 is a block diagram showing a configuration of a musical keyboard instrument 100 according to a first embodiment of the present disclosure. The musical keyboard instrument 100 is an electronic musical instrument having a keyboard 10, a detection system 20, an information processing apparatus 30, and a sound output device 40. The keyboard 10 comprises a plurality of keys 12 including black and white keys. The keys 12 are each movable members that are displaced by a playing operation of a user. The detection system 20 detects displacement of the keys 12. The information processing apparatus 30 generates an audio signal V in accordance with a detection result made by the detection system 20. The audio signal V is a signal representative of a music sound with a pitch that corresponds to one of the keys 12 operated by the user. The sound output device 40 outputs sound represented by the audio signal V. The sound output device 40 is a speaker or a headphone, for example.

Figure 2:
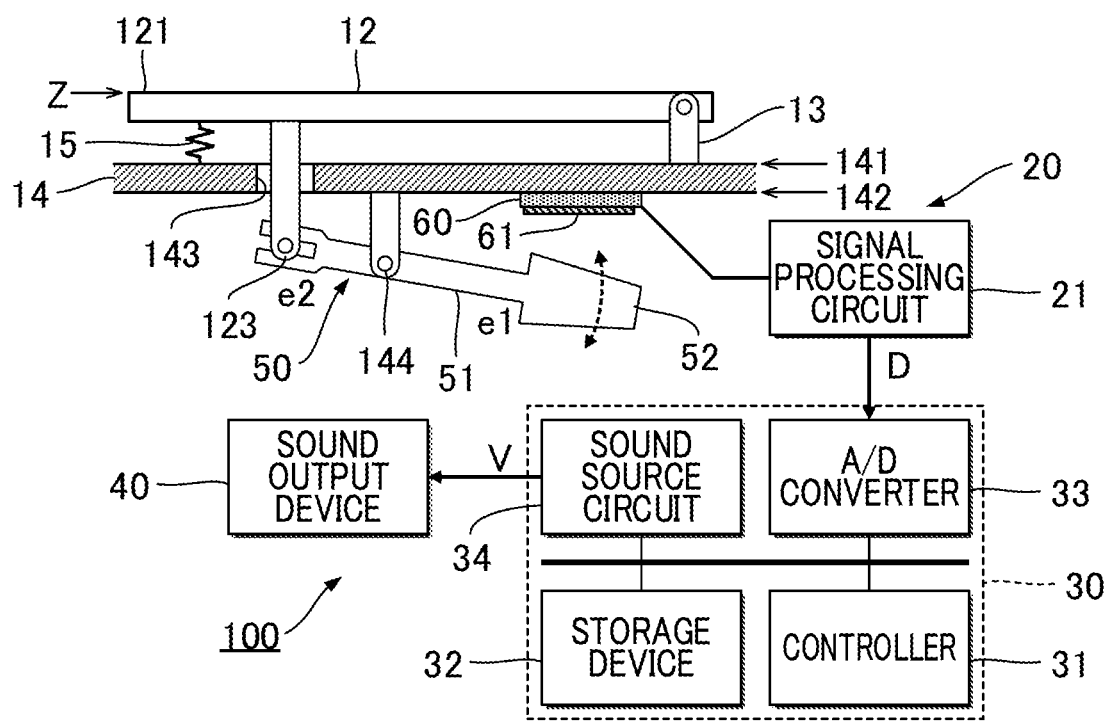
FIG. 2 is a block diagram showing a configuration of the musical keyboard instrument.

FIG. 2 is a block diagram showing a specific configuration of the musical keyboard instrument 100, focusing on one of the keys 12 of the keyboard 10. The musical keyboard instrument 100 has a supporting member 14. The supporting member 14 is a structure (frame structure) that supports each element of the musical keyboard instrument 100. The supporting member 14 includes a first surface 141 and an opposing second surface 142. The first surface 141 faces the keyboard 10. A supporter 13 is mounted to the first surface 141 of each of the keys 12 on the keyboard 10, and each of the keys 12 is supported by the supporting member 14 by way of the supporter 13 that acts as a fulcrum. An elastic body 15 is provided between the undersurface of each of the keys 12 and the first surface 141 of the supporting member 14. The elastic body 15 urges the keys 12 in an upward vertical direction. An end 121 of each of the keys 12 is displaced in a vertical direction when the user depresses or releases a key.

A connecting member 123 is provided on the undersurface of each of the keys 12. The connecting member 123 protrudes in a downward vertical direction from the undersurface of each of the keys 12. The supporting member 14 is provided with an opening 143 through which the connecting member 123 penetrates. Thus, the connecting member 123 protrudes in the downward vertical direction from the second surface 142 of the supporting member 14. Further, a supporter 144 is provided on the second surface 142 of the supporting member 14. The supporter 144 protrudes in the downward vertical direction from the second surface 142.

An adjustment weight 50 is provided for each of the keys 12 in a space below the supporting member 14 such that the supporting member 14 resides between each of the keys 12 and the adjustment weight 50. The adjustment weight 50 is a hammer weight for adjusting a touch feel for a user when the user operates a key 12. The adjustment weight 50 is formed from a magnetic body (ferromagnetic body) or a conductive body. Specifically, the adjustment weight 50 is made from a magnetic body, such as iron or ferrite.

The adjustment weight 50 is a structure that consists of a rotatable part 51 and a load part 52 formed as a single body. The rotatable part 51 is pillar shaped (e.g., prismatic or columnar) and spans a first end e1 and a second end e2. The load part 52 is a weight-shaped part of a predetermined weight, and is mounted to the first end e1 of the rotatable part 51. The second end e2 is supported by the connecting member 123. The adjustment weight 50 is rotatably supported by the supporter 144 at a point between the first end e1 and the second end e2. By the above configuration, the adjustment weight 50 rotates about the supporter 144, which acts as a fulcrum, responsive to displacement of a key 12. The vertical position of the load part 52 changes with the displacement of the key 12. Specifically, the load part 52 moves vertically upward upon depression of a key and moves vertically downward upon release of the key. The load part 52 moves in conjunction with the displacement of the key 12 in the manner described above, and the user senses moderate key resistance upon depressing the key (i.e., feels the resistance while touching the key). The adjustment weight 50 thus serves to adjust a touch feel of the user when the key 12 is operated by the user.

The detection system 20 generates a detection signal D at a level depending on a vertical position Z of the end 121 for each of the keys 12. The position Z is an amount of displacement of the end 121, relative to a rest position of the end 121 in a state in which no load is applied to the key 12.

The detection system 20 has a signal generator 60 and a signal processing circuit 21. The signal generator 60 is provided on the second surface 142 of the supporting member 14 for each key 12. The signal generator 60 includes a coil 61. The signal generator 60 and the load part 52 of the adjustment weight 50 oppose each other, and are vertically spaced apart from each other. A distance between the signal generator 60 and the load part 52 (a distance between the coil 61 and the load part 52) changes depending on the position Z of the end 121 of the key 12.

Figure 3:
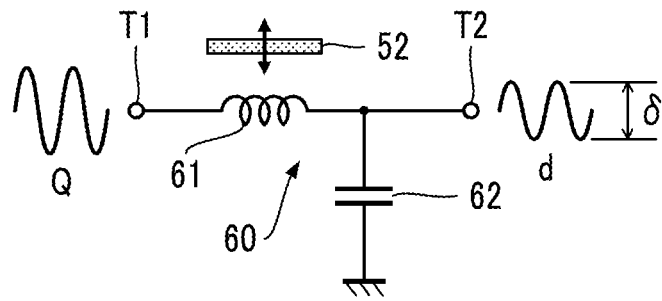
FIG. 3 is a circuit diagram of a signal generator.

FIG. 3 is a circuit diagram showing an electric configuration of the signal generator 60. The signal generator 60 is a filter that includes an input T1, an output T2, the coil 61, and a capacitive element 62. The coil 61 is wired between the input T1 and the output T2. The capacitive element 62 is wired between the output T2 and a ground wire. The signal generator 60 is a low pass filter (LPF) that reduces band components exceeding a cut-off frequency Fc in a signal supplied to the input T1. The cut-off frequency Fc is configured to have a value (Fc=$1/(2\pi(LC)^{1/2})$) depending on the inductive coefficient L of the coil 61 and the capacitive coefficient C of the capacitive element 62.

Figure 4:
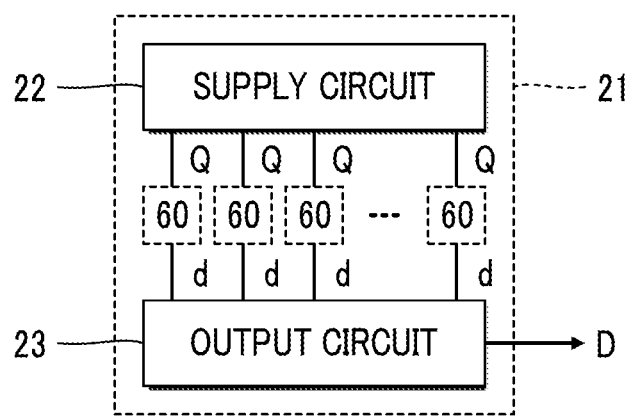
FIG. 4 is a block diagram showing a configuration of a signal processing circuit.

The signal processing circuit 21 in FIG. 2 generates a detection signal D with a level depending on a distance between the coil 61 and the load part 52. FIG. 4 is a block diagram showing a specific configuration of the signal processing circuit 21. The signal processing circuit 21 includes a supply circuit 22 and an output circuit 23. The supply circuit 22 supplies a reference signal Q to each of a plurality of signal generators 60. The reference signal Q is an electric voltage signal, a level of which changes depending on a frequency Fref. The reference signal Q may be a cyclic signal of a freely-selected waveform, such as a sine wave. The frequency Fref of the reference signal Q is for example 1 MHz or so. The supply circuit 22 supplies the plurality of signal generators 60 with a reference signal Q by time division. Specifically, the supply circuit 22 is a demultiplexer that selects each of the signal generators 60 one by one, and supplies the reference signal Q to a signal generator 60 that is in a selected state. Thus, the reference signal Q is supplied to each of the signal generators 60 by time division. It is of note that the cycle of the reference signal Q is sufficiently shorter than a duration of a period during which the supply circuit 22 selects one signal generator 60.

As shown in FIG. 3, the reference signal Q is supplied to the input T1 of the signal generator 60. The signal generator 60 is a filter that includes the coil 61, where the filter is configured to generate a detection signal d from the reference signal Q. The detection signal d is a cyclic signal, a level of which changes in the same cycle as that of the reference signal Q.

Figure 5:
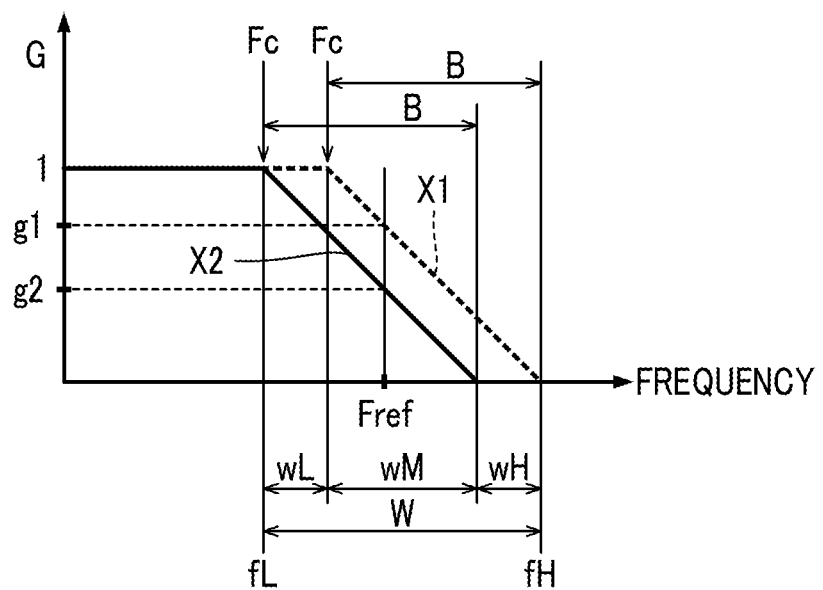
FIG. 5 shows frequency responses of the signal generator.

FIG. 5 shows a frequency response X (X1,X2) of the signal generator 60. The frequency response X1 is a frequency response X of the signal generator 60 in a state in which the load part 52 approaches closest to the coil 61 (hereafter, "closest state"). In contrast, the frequency response X2 is a frequency response X of the signal generator 60 in a state in which the load part 52 is farthest away from the coil 61 (hereafter, "farthest state").

As the load part 52 approaches, the inductive coefficients L of the coil 61 are reduced. The frequency response X of the signal generator 60 therefore changes depending on a distance between the load part 52 and the coil 61. Specifically, the cut-off frequency Fc in the frequency response X changes depending on a distance between the load part 52 and the coil 61. For example, the cut-off frequency Fc rises as the load part 52 approaches closer to the coil 61. The gain G over the frequency Fref of the reference signal Q changes depending on a distance between the load part 52 and the coil 61. For example, the gain G over the frequency Fref takes a value of g1 in the closest state, whereas in the farthest state, the gain G over the frequency Fref takes a value of g2, which is below the value g1.

As will be understood from the above explanation, a detection signal d with an amplitude level δ corresponding to the distance between the load part 52 and the coil 61 is output from the output T2 of the signal generator 60. In other words, the load part 52 is a part (detection part) that is detected by the detection system 20.

In a frequency band B in FIG. 5 the gain G changes depending on a frequency of a frequency band in which the frequency is above the cut-off frequency Fc. The frequency Fref of the reference signal Q is within a range W between a frequency fL and a frequency fH. The frequency fL is the lower limit value of the frequency band B in the frequency response X2 when the load part 52 is in the farthest state and corresponds to the cut-off frequency Fc in the frequency response X2. The frequency fH is the higher limit value of the frequency band B in the frequency response X1 when the load part 52 is in the closest state and corresponds to a frequency at which the gain G is 0 in the frequency response X1.

For example, the frequency Fref of the reference signal Q, the inductive coefficients L of the coil 61 and the capacitive coefficients C of the capacitive element 62 are configured such that the frequency Fref falls within the frequency band B in either the closest state or the farthest state. Thus, of the range W, the frequency Fref of the reference signal Q occurs within a range wM that overlaps between the frequency band B in the frequency response X1 and the frequency band B in the frequency response X2. In other embodiments, the frequency Fref may occur, of the range W, within a range wL in which the gain G takes a constant value (G=1) in the frequency response X1, or the frequency Fref may occur, of the range W, within a range wH in which the gain G takes a constant value (G=0) in the frequency response X2.

The output circuit 23 in FIG. 4 generates a detection signal D by sequentially arranging on a time axis detection signals d that are sequentially output from each of the signal generators 60. The detection signal D is a voltage signal with amplitude levels δ, each of which is dependent on a distance between the load part 52 and the coil 61 in each of the plurality of respective keys 12. As described previously, the distance between the load part 52 and the coil 61 changes in conjunction with the position Z of each key 12. Accordingly, the detection signal D is a signal depending on different positions Z of the plurality of respective keys 12. The detection signal D generated by the output circuit 23 is supplied to the information processing apparatus 30.

The information processing apparatus 30 in FIG. 2 analyzes the detection signal D supplied from the signal processing circuit 21, to determine the position Z of each key 12. The information processing apparatus 30 is realized by a computer system that includes a controller 31, a storage device 32, an A/D converter 33 and a sound source circuit 34. The A/D converter 33 converts the detection signal D supplied from the signal processing circuit 21 from an analog to a digital signal.

The controller 31 comprises one or more processors for controlling each of elements of the musical keyboard instrument 100. For example, the controller 31 is constituted of one or more types among different types, such as a Central Processing Unit (CPU), a Sound Processing Unit (SPU), a Digital Signal Processor (DSP), a Field Programmable Gate Array (FPGA), or an Application Specific Integrated Circuit (ASIC).

The storage device 32 comprises one or more memories that store programs executed by the controller 31 and data used by the controller 31. The storage device 32 is constituted of, for example, a known recording medium, such as a magnetic recording medium or a semiconductor recording medium. The storage device 32 may comprise a combination of different types of recording media. The storage device 32 may be a portable recording medium detachable from the musical keyboard instrument 100, or may be an external recording medium (e.g., online storage), with which the musical keyboard instrument 100 can communicate.

The controller 31 analyzes the position Z of each key 12 by analyzing the detection signal D after conversion by the A/D converter 33. The controller 31 instructs the sound source circuit 34 to produce a music sound based on the position Z of each key 12. The sound source circuit 34 generates an audio signal V representative of the music sound as instructed by the controller 31. Thus, the sound source circuit 34 generates the audio signal V in accordance with the amplitude levels δ of the detection signal D. For example, the volume of the audio signal V is controlled in accordance with the amplitude levels δ. The audio signal V is supplied from the sound source circuit 34 to the sound output device 40, whereby a music sound that accords with playing operations performed by a user (depression or release of each key 12) is output from the sound output device 40.

Figure 6:
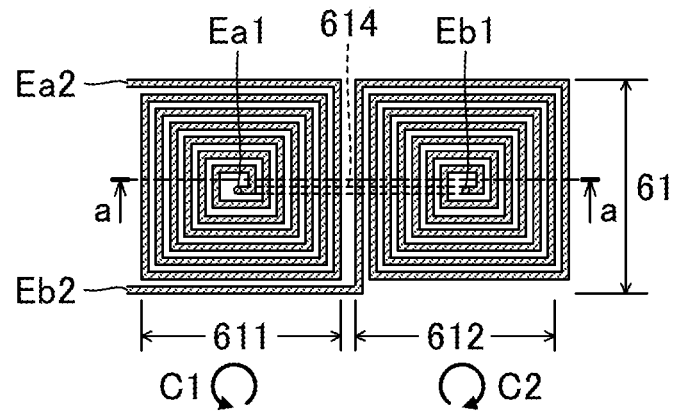
FIG. 6 is a plane view of a coil.
Figure 7:
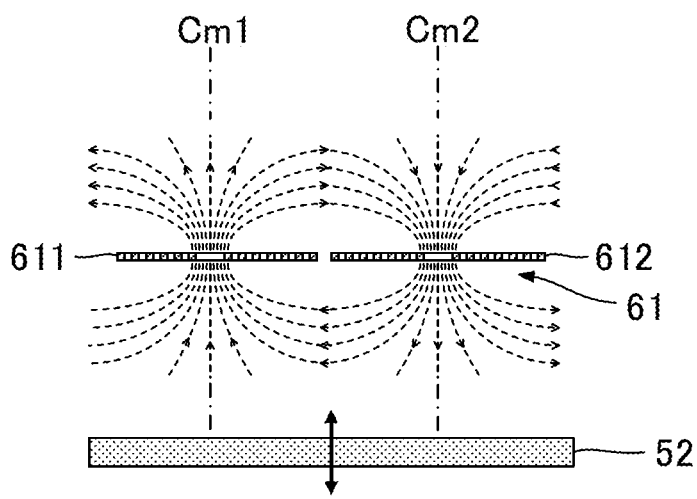
FIG. 7 is a cross-sectional view along line a-a in FIG. 6.

FIG. 6 is a plane view showing an example configuration of the coil 61 in the signal generator 60. FIG. 7 is a cross-sectional view along line a-a in FIG. 6. The coil 61 may comprise a wiring pattern formed on a surface of a circuit board. The coil 61 includes a first portion 611 and a second portion 612. The first portion 611 and the second portion 612 are formed in different regions of the circuit board from each other, as seen in plane view. Specifically, the first portion 611 and the second portion 612 are arranged next to each other along the longitudinal direction of the key 12.

The first portion 611 comprises a spiral winding that is wound from an end Ea1 of the inner circumference to an end Ea2 of the outer circumference. Likewise, the second portion 612 comprises a spiral winding that is wound from an end Eb1 of the inner circumference to an end Eb2 of the outer circumference. The end Ea2 is wired to the input T1, and the end Eb2 is wired to the output T2. The end Ea1 and the end Eb1 are wired to each other via a relay wire 614.

As will be understood from the foregoing, a current flowing through the first portion 611 and a current flowing through the second portion 612 flow in opposite senses. Specifically, in a state in which a current flows through the first portion 611 in a direction C1, a current flows through the second portion 612 in a direction C2 opposite to the first direction C1. Accordingly, as shown in FIG. 7, the first portion 611 and the second portion 612 are configured to generate opposite sense magnetic fields. In other words, magnetic fields moving in a direction from the first portion 611 to the second portion 612 and in an opposite direction are generated. By the above configuration, it is possible to limit or reduce diffusion of the magnetic fields over to and across different keys 12 adjacent to each other. Therefore, it is possible to generate a detection signal D that highly accurately represents the position Z of each of the keys 12.

The load part 52 of the adjustment weight 50 opposes both the first portion 611 and the second portion 612 of the coil 61. Specifically, a central axis Cm1 of the first portion 611 and a central axis Cm2 of the second portion 612 overlap the load part 52. By the above configuration, a magnetic field formed by the first portion 611 and one formed by the second portion 612 are both affected by the load part 52. Therefore, it is possible to generate a detection signal D that highly accurately represents slight displacements of the key 12, and the attained effect is remarkable.

As described above, in the first embodiment, since the frequency response X of the signal generator 60 changes depending on a distance between the load part 52 and the coil 61, a detection signal D with amplitude levels δ that accord with the distance is generated. In other words, a detection signal D according to the position Z of each of respective keys 12 is generated. In the above configuration, since the amplitude levels δ of the detection signal D changes depending on the frequency response X of the signal generator 60, it is possible to change the level of the detection signal D to a high degree responsive to the displacement of the key 12. Therefore, the first embodiment is advantageous in that it is possible to detect a detection signal D that highly accurately represents slight displacements of the key 12.

In the first embodiment in particular, the distance between the load part 52 and the coil 61 in a central axis direction of the coil 61 changes depending on displacement of the key 12. Therefore, it is possible to change the amplitude level 6 of the detection signal D to a high degree responsive to displacement of each key 12 compared with a configuration in which the load part 52 and the coil 61 move relative to each other within a plane perpendicular to the central axis of the coil 61 (i.e., a configuration in which the distance between the load part 52 and the coil 61 does not change in the central axis direction of the coil 61).

Further, in the first embodiment, the adjustment weight 50 (load part 52) for adjusting the touch feel for a user when operating the key 12 is also used as the detection part for detecting the position Z of the key 12. Therefore, an advantage is also obtained in that the configuration of the musical keyboard instrument 100 is simplified compared to a configuration in which a separate detection part is provided in addition to the adjustment weight 50.

B: Second Embodiment

Description will now be given of a second embodiment of the present disclosure. It is of note that in each of the embodiments described below, like reference signs are used for elements having functions or effects identical to those of elements described in the first embodiment, and detailed explanations of such elements are omitted as appropriate.

Figure 8:
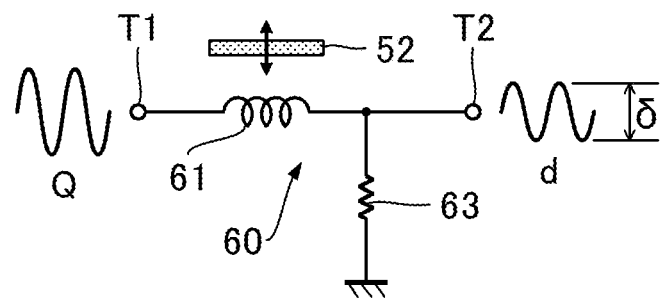
FIG. 8 is a circuit diagram of a signal generator according to a second embodiment.

FIG. 8 is a circuit diagram showing an electric configuration of a signal generator 60 according to the second embodiment. The signal generator 60 in the second embodiment is a filter that includes an input T1, an output T2, a coil 61, and a resistive element 63. The coil 61 is wired between the input T1 and the output T2. Similarly to the example shown in FIG. 6, the coil 61 includes a first portion 611 and a second portion 612 whose current flows are opposite in sense. The resistive element 63 is wired between the output T2 and a ground wire.

The signal generator 60 is a low pass filter, similarly to the first embodiment, and reduces components exceeding a cut-off frequency Fc in the reference signal Q supplied to the input T1. The cut-off frequency Fc is configured to have a value ($Fc=R/(2\pi L)$) depending on the inductive coefficient L of the coil 61 and the electrical resistance R of the resistive element 63. The same effects as those in the first embodiment can also be attained in the second embodiment.

C: Third Embodiment

Figure 9:
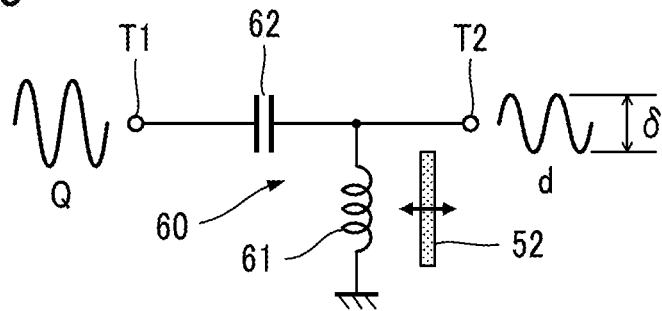
FIG. 9 is a circuit diagram of a signal generator according to a third embodiment.

FIG. 9 is a circuit diagram showing an electric configuration of a signal generator 60 according to the third embodiment. The signal generator 60 according to the third embodiment is a filter that includes an input T1, an output T2, a coil 61, and a capacitive element 62. The capacitive element 62 is wired between the input T1 and the output T2. The coil 61 is wired between the output T2 and a ground wire Similarly to the example shown in FIG. 6, the coil 61 includes a first portion 611 and a second portion 612 whose current flows are opposite in sense.

Figure 10:
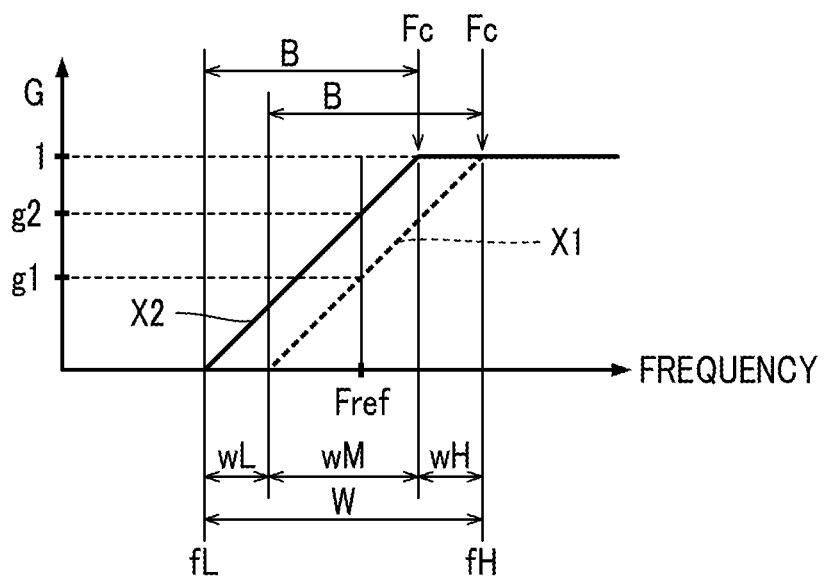
FIG. 10 shows frequency responses of the signal generator in the third embodiment.

FIG. 10 shows a frequency response X (X1,X2) of the signal generator 60 according to the third embodiment. FIG. 10 shows both the frequency response X1 in the closest state and the frequency response X2 in the farthest state. The signal generator 60 is a high pass filter (HPF) that reduces band components below the cut-off frequency Fc in the reference signal Q supplied to the input T1. The cut-off frequency Fc is configured to have a value ($Fc=1/(2\pi (LC)^{1/2})$) depending on the inductive coefficient L of the coil 61 and the capacitive coefficient C of the capacitive element 62.

The cut-off frequency Fc in the frequency response X changes depending on a distance between the load part 52 and the coil 61. For example, the cut-off frequency Fc of the signal generator 60 rises as the load part 52 approaches closer to the coil 61. The gain G over the frequency Fref of the reference signal Q changes depending on a distance between the load part 52 and the coil 61. For example, the gain G over the frequency Fref takes a value of g1 in the closest state, whereas in the farthest state, the gain G over the frequency Fref takes a value of g2, which is above the value g1. Accordingly, a detection signal d with an amplitude level δ corresponding to the distance between the load part 52 and the coil 61 is output from the output T2 of the signal generator 60. The same effects as those in the first embodiment can also be attained in the third embodiment.

The frequency band B in FIG. 10 is a range in which the gain G changes depending on a frequency in a frequency band in which the frequency is below the cut-off frequency Fc. The frequency Fref of the reference signal Q is within a range W between a frequency fL and a frequency fH. The frequency fL is the lower limit value of the frequency band B in the frequency response X2 when the load part 52 is in the farthest state and corresponds to a frequency at which the gain G is 0 in the frequency response X2. The frequency fH is the higher limit value of the frequency band B in the frequency response X1 when the load part 52 is in the closest state and corresponds to the cut-off frequency Fc in the frequency response X1.

For example, the frequency Fref of the reference signal Q, the inductive coefficient L of the coil 61 and the capacitive coefficient C of the capacitive element 62 are configured such that the frequency Fref falls within the frequency band B in either the closest state or the farthest state. Thus, of the range W, the frequency Fref of the reference signal Q occurs within a range wM that overlaps between the frequency band B in the frequency response X1 and the frequency band B in the frequency response X2. In other embodiments, the frequency Fref may occur, of the range W, within a range wL in which the gain G takes a constant value (G=0) in the frequency response X1, or the frequency Fref may occur, of the range W, within a range wH in which the gain G takes a constant value (G=1) in the frequency response X2.

D: Fourth Embodiment

Figure 11:
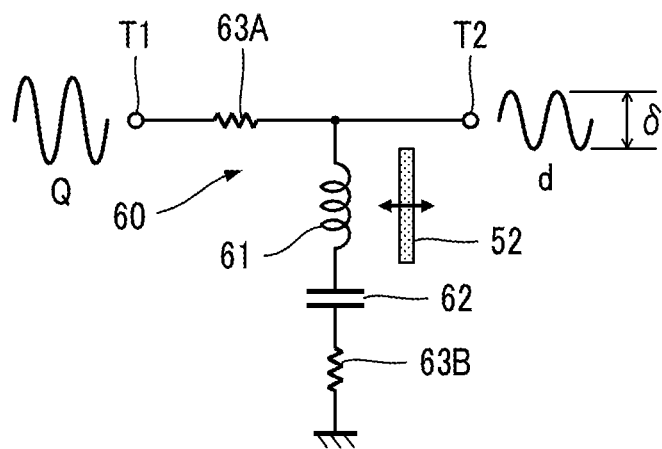
FIG. 11 is a circuit diagram of a signal generator according to a fourth embodiment.

FIG. 11 is a circuit diagram showing an electric configuration of a signal generator 60 according to the fourth embodiment. The signal generator 60 according to the fourth embodiment is a filter that includes an input T1, an output T2, a coil 61, a capacitive element 62, and resistive elements 63A and 63B. The resistive element 63A is wired between the input T1 and the output T2. The coil 61, the capacitive element 62 and the resistive element 63B are wired between the output T2 and a ground wire. Similarly to the example shown in FIG. 6, the coil 61 includes a first portion 611 and a second portion 612 whose current flows are opposite in sense.

Figure 12:
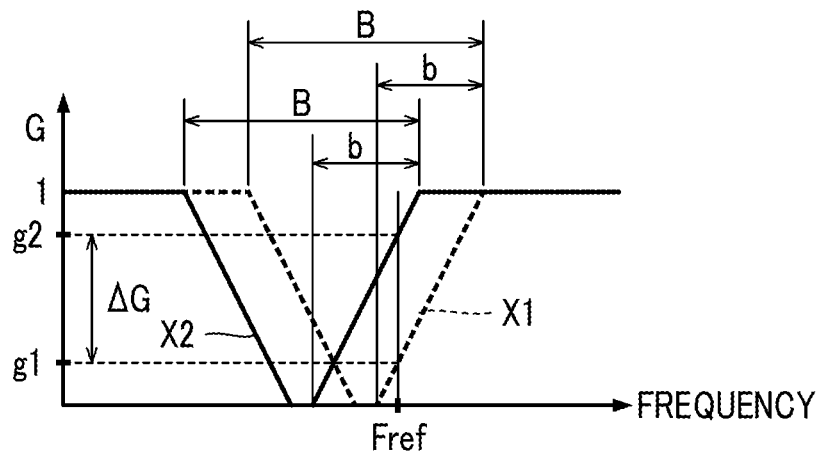
FIG. 12 shows frequency responses of the signal generator in the fourth embodiment.

FIG. 12 shows a frequency response X (X1,X2) of the signal generator 60 according to the fourth embodiment. FIG. 12 shows both the frequency response X1 in the closest state and the frequency response X2 in the farthest state. The signal generator 60 according to the fourth embodiment is a band elimination filter (BEF) that reduces components in a frequency band (stopband) B in the reference signal Q. Specifically, the signal generator 60 is a notch filter with a sufficiently narrow frequency band B.

The frequency response X of the signal generator 60 changes depending on a distance between the load part 52 and the coil 61. Specifically, the position of the frequency band B on a frequency axis changes depending on the distance. For example, the frequency band B of the signal generator 60 shifts to higher frequencies as the load part 52 approaches the coil 61. Accordingly, the gain G over the frequency Fref of the reference signal Q changes depending on a distance between the load part 52 and the coil 61. For example, the gain G over the frequency Fref takes a value of g1 in the closest state, whereas in the farthest state, the gain G over the frequency Fref takes a value of g2, which exceeds the value g1. Accordingly, as in the first embodiment, a detection signal d with an amplitude level δ corresponding to the distance between the load part 52 and the coil 61 is output from the output T2 of the signal generator 60. It is of note that the frequency Fref of the reference signal Q, the inductive coefficient L of the coil 61 and the capacitive coefficient C of the capacitive element 62 are configured such that the frequency Fref falls within the frequency band b in either the closest state or the farthest state. The frequency band b is a range in which the gain G increases over frequencies in the frequency band B. The frequency band b may be a range in which the gain G decreases over frequencies. Further, the frequency Fref of the reference signal Q may be configured within a range in which the gain G is constant in either of the frequency response X1 or the frequency response X2.

The same effects as those in the first embodiment can also be attained in the fourth embodiment. The band elimination filter has a feature that the gradient of the gain G over frequencies is steeper compared to the low pass filter or the high pass filter. Thus, according to the fourth embodiment, it is easier to allow for a greater change in gain ΔG between the closest state and the farthest state (in turn a greater change in the amplitude level δ) as compared to the first embodiment. As a result, an advantage is obtained in that it is possible to generate a detection signal D that highly accurately represents slight displacements of each key 12.

E: Fifth Embodiment

Figure 13:
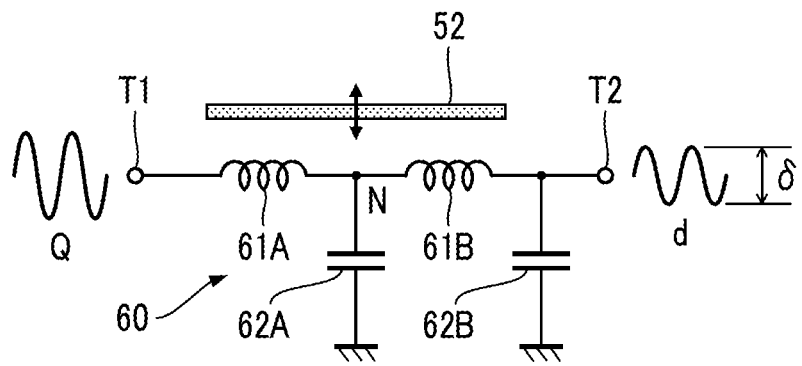
FIG. 13 is a circuit diagram of a signal generator according to a fifth embodiment.

FIG. 13 is a circuit diagram showing an electric configuration of a signal generator 60 according to the fifth embodiment. The signal generator 60 according to the fifth embodiment is a low pass filter and includes an input T1, an output T2, a coil 61A, a coil 61B, and capacitive elements 62A and 62B. Specifically, the signal generator 60 according to the fifth embodiment is configured such that multiple stages (specifically two stages) of low pass filters are coupled to each other in series. Each low pass filter is the same as that described as an example in the first embodiment.

The coil 61A and the coil 61B are wired between the input T1 and the output T2. Specifically, the coil 61A is wired between the input T1 and the coupling point N, and the coil 61B is wired between the coupling point N and the output T2. The coil 61A is the first portion 611 shown in FIG. 6, and the coil 61B is the second portion 612 shown in FIG. 6. Accordingly, the direction of the current flowing through the coil 61A and the direction of the current flowing through the coil 61B are opposite in sense relative to each other. Thus, the coil 61A and the coil 61B together correspond to a single coil 61 as described in the first embodiment. The capacitive element 62A is wired between the coupling point N and a ground wire, and the capacitive element 62B is wired between the output T2 and a ground wire.

Figure 14:
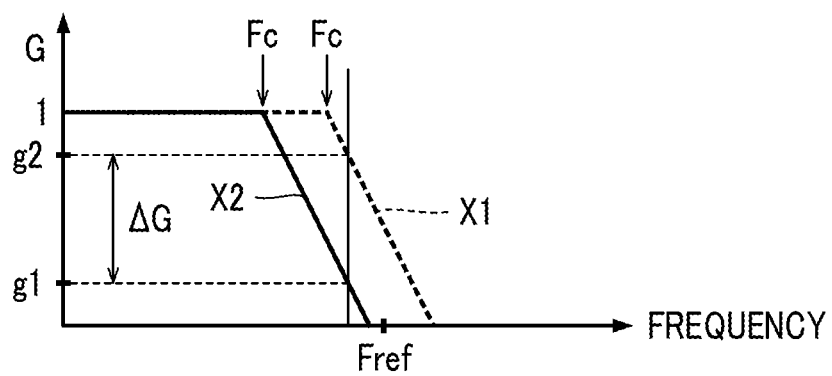
FIG. 14 shows frequency responses of the signal generator in the fifth embodiment.

FIG. 14 shows a frequency response X (X1,X2) of the signal generator 60 according to the fifth embodiment. FIG. 14 shows both the frequency response X1 in the closest state and the frequency response X2 in the farthest state.

As will be understood from FIG. 14, since the signal generator 60 comprises the multiple stages of low pass filters in the fifth embodiment, the gradient of the gain G over frequencies is steeper as compared to the signal generator 60 according to the first embodiment, which comprises a single low pass filter. Thus, according to the fifth embodiment, it is easier to allow for a greater change in gain ΔG between the closest state and the farthest state (in turn a greater change in the amplitude level δ) as compared to the first embodiment. By the above configuration, an advantage is obtained in that it is possible to generate a detection signal D that highly accurately represents slight displacements of each key 12.

F: Sixth Embodiment

Figure 15:
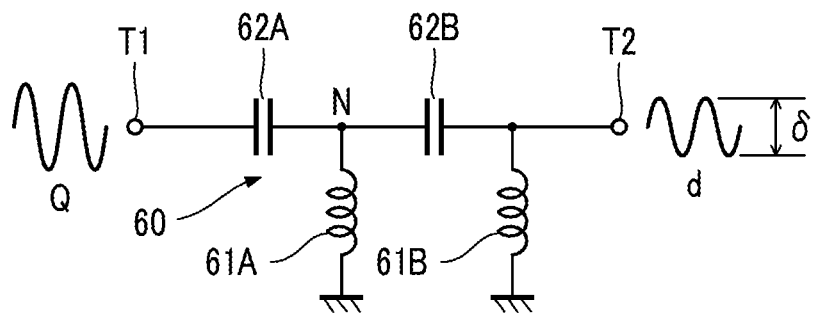
FIG. 15 is a circuit diagram of a signal generator according to a sixth embodiment.

FIG. 15 is a circuit diagram showing an electric configuration of a signal generator 60 according to the sixth embodiment. The signal generator 60 according to the sixth embodiment is a high pass filter and includes an input T1, an output T2, a coil 61A, a coil 61B, and capacitive elements 62A and 62B. Specifically, the signal generator 60 according to the sixth embodiment is configured such that multiple stages (specifically two stages) of high pass filters are coupled to each other in series. Each high pass filter is the same as that described as an example in the third embodiment.

The capacitive elements 62A and 62B are wired between the input T1 and the output T2. Specifically, the capacitive element 62A is wired between the input T1 and the coupling point N, and the capacitive element 62B is wired between the coupling point N and the output T2. The coil 61A is wired between the coupling point N and a ground wire. The coil 61B is wired between the output T2 and a ground wire. The coil 61A is the first portion 611 shown in FIG. 6, and the coil 61B is the second portion 612 shown in FIG. 6. Accordingly, the direction of the current flowing through the coil 61A and the direction of the current flowing through the coil 61B are opposite in sense relative to each other. Thus, the coil 61A and the coil 61B together correspond to a single coil 61 as described in the first embodiment.

Figure 16:
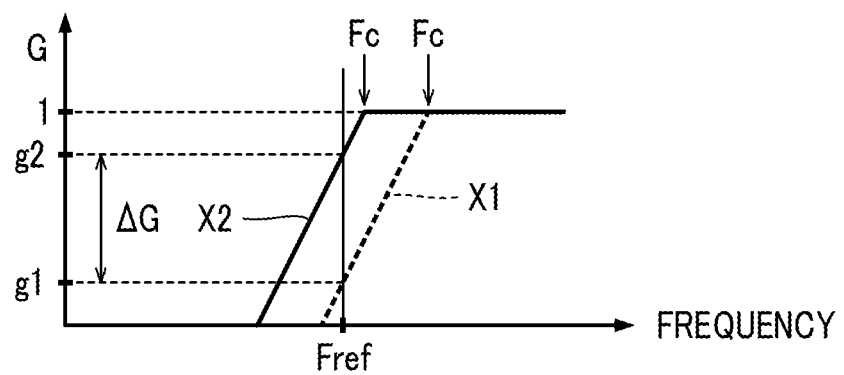
FIG. 16 shows frequency responses of the signal generator in the sixth embodiment.

FIG. 16 shows a frequency response X (X1,X2) of the signal generator 60 according to the sixth embodiment. FIG. 16 shows both the frequency response X1 in the closest state and the frequency response X2 in the farthest state.

As will be understood from FIG. 16, since the signal generator 60 comprises the multiple stages of high pass filters in the sixth embodiment, the gradient of the gain G over frequencies is steeper as compared to the signal generator 60 according to the third embodiment, which comprises a single high pass filter. Thus, according to the sixth embodiment, it is easier to allow for a greater change in gain ΔG between the closest state and the farthest state (in turn a greater change in the amplitude level δ) compared to the third embodiment. By the above configuration, an advantage is obtained in that it is possible to generate a detection signal that highly accurately represents slight displacements of each key 12.

As described, in FIG. 13 and FIG. 15, the first portion 611 is used as the coil 61A, and the second portion 612 is used as the coil 61B. Alternatively, each of the coil 61A and the coil 61B may comprise a coil 61 that includes the first portion 611 and the second portion 612.

G: Modifications

Specific modifications added to each of the aspects described above are described below. Two or more modes selected from the following descriptions may be combined with one another as appropriate in so far as such combination does not give rise to any contradiction.

Figure 17:
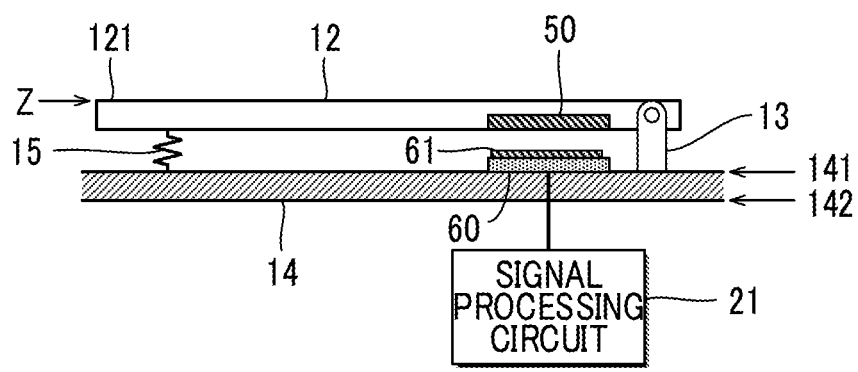
FIG. 17 is a block diagram showing a configuration of a musical keyboard instrument according to a modification.

(1) In each of the above embodiments, a hammer weight that is coupled to the key 12 via the connecting member 123 is given as an example of the adjustment weight 50. However, the adjustment weight 50 is not limited to the above example. For example, as shown in FIG. 17, the adjustment weight 50 may be a counterweight directly mounted to the key 12. The adjustment weight 50 is formed from a magnetic or conductive body for example. In the configuration shown in FIG. 17, the signal generator 60 is mounted to the first surface 141 of the supporting member 14. The distance between the adjustment weight 50 and the signal generator 60 changes depending on the position Z of the key 12. Therefore, similarly to each of the above embodiments, a detection signal D is generated in accordance with a position Z of each of the respective keys 12 by the signal processing circuit 21.

(2) In each of the above embodiments, the adjustment weight 50 for adjusting the touch feel for a user when operating the key 12 is also used as the detection part for detecting the position Z of the key 12. In other words, one of the elements constituting the musical keyboard instrument 100 is also used as the detection part. However, such a configuration need not necessarily be employed, and an element separate from an element essential to the keyboard instrument 100 may be provided as the detection part.

Figure 18:
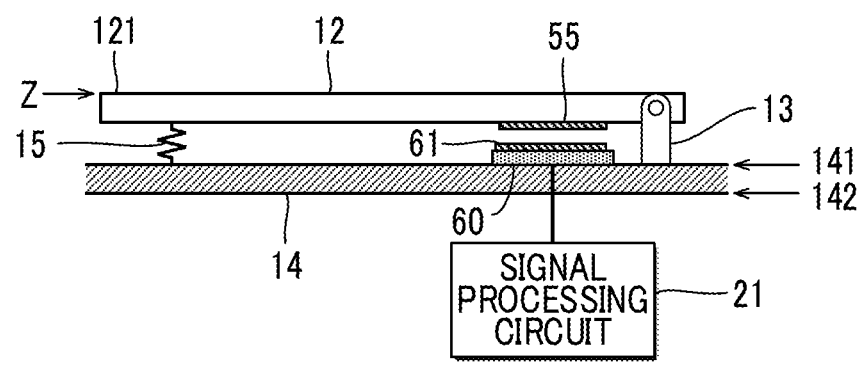
FIG. 18 is a block diagram showing a configuration of a musical keyboard instrument according to a modification.

For example, as shown in FIG. 18, a coil 55 disposed on the key 12 may be used as the detection part. The coil 55 is disposed on the undersurface of the key 12 such that it opposes the coil 61 of the signal generator 60 disposed on the first surface 141 of the supporting member 14. The coil 55 is constituted of a wiring pattern formed of a magnetic or conductive body on a surface of a circuit board, and comprises a resonant circuit that resonates due to mutual induction with the coil 61.

Figure 19:
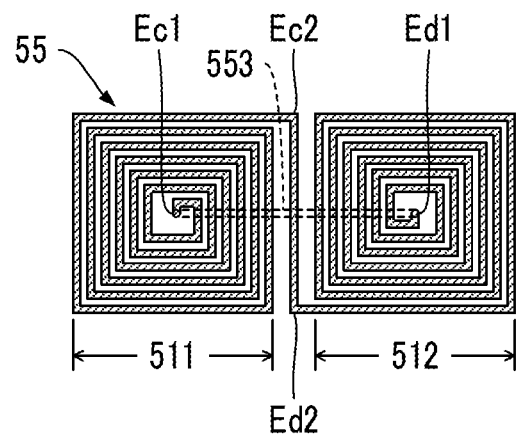
FIG. 19 is a plane view showing a configuration of a coil according to a modification.

FIG. 19 is a plane view showing an example configuration of the coil 55. The coil 55 includes a first portion 551 and a second portion 552. The first portion 551 and the second portion 552 are formed in different regions from each other in plane view. Specifically, the first portion 551 and the second portion 552 are arranged next to each other along the longitudinal direction of the key 12.

The first portion 551 is a spiral winding that is wound from an end Ec1 of the inner circumference to an end Ec2 of the outer circumference. Likewise, the second portion 552 comprises a spiral winding that is wound from an end Ed1 of the inner circumference to an end Ed2 of the outer circumference. The end Ec2 and the end Ed2 are wired to each other. The end Ec1 and the end Ed1 are wired to each other via the coupling wire 553.

By the above configuration, electromagnetic induction occurs by way of a magnetic field generated in the coil 61 in response to supply of the reference signal Q, and the electromagnetic induction creates an induced current in the coil 55. Accordingly, in the coil 55, a magnetic field is generated that has a direction that cancels the change in the magnetic field of the coil 61. The magnetic field generated in the coil 61 changes depending on the distance between the coil 55 and the coil 61. Accordingly, a detection signal d with an amplitude level δ that depends on the distance between the coil 55 and the coil 61 is output from the output T2 of the signal generator 60. Thus, similarly to each of the above embodiments, a detection signal D depending on the position Z of the key 12 is generated.

As will be understood from the example shown in FIG. 19, the current flow in the first portion 551 and the current flow in the second portion 552 are opposite in sense. Accordingly, opposite sense magnetic fields are generated in the first portion 551 and the second portion 552. In other words, magnetic fields moving in directions from the first portion 551 to the second portion 552 and in an opposite direction are generated. By the above configuration, it is possible to limit or reduce diffusion of the magnetic fields over to and across different keys 12 adjacent to each other. Thus, it is possible to generate a detection signal D that highly accurately represents the position Z of each of the keys 12.

(3) Each of the above embodiments describes a configuration for detecting the displacement of the key 12 in the musical keyboard instrument 100. However, a movable member whose displacement is detected by the detection system 20 is not limited to the key 12. Specific modes of the movable member are described below.

Mode A

Figure 20:
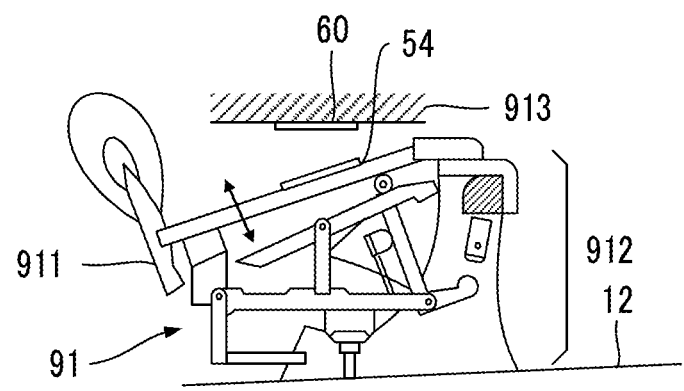
FIG. 20 shows a configuration of a musical keyboard instrument according to a modification.

FIG. 20 is a schematic diagram of a configuration in which the detection system 20 is applied to a strike mechanism 91 of the musical keyboard instrument 100. As in an acoustic piano, the strike mechanism 91 is a mechanism that strikes a string (not shown) in conjunction with a displacement of each key 12 in the keyboard 10. Specifically, the strike mechanism 91 includes, for each key 12, a hammer 911 capable of striking a string by rotation and a transmission mechanism 912 (e.g., a whippen, jack, repetition lever, etc.) that causes the hammer 911 to rotate in conjunction with the displacement of the key 12. By the above configuration, the detection system 20 detects displacement of the hammer 911. Specifically, the detection part 54 formed from a magnetic or conductive body is disposed on the hammer 911 (e.g., at a hammer shank). On the other hand, the signal generator 60 is disposed on the supporting member 913. The supporting member 913 is a structure configured to support, for example, the strike mechanism 91. The detection part 54 may be disposed on a member of the strike mechanism 91 other than the hammer 911.

Mode B

Figure 21:
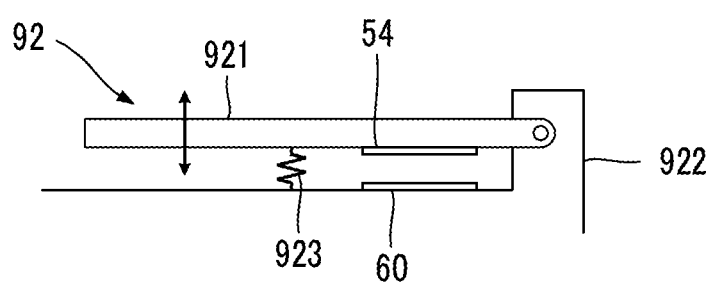
FIG. 21 is a block diagram showing a configuration of a musical keyboard instrument according to a modification.

FIG. 21 is a schematic diagram of a configuration in which the detection system 20 is applied to a pedal mechanism 92 of the musical keyboard instrument 100. The pedal mechanism 92 includes a pedal 921 operated by a user's foot, a supporting member 922 that supports the pedal 921, an elastic body 923 that urges the pedal 921 in the upward vertical direction. By the above configuration, the detection system 20 detects the displacement of the pedal 921. Specifically, the detection part 54 is disposed on the undersurface of the pedal 921. The signal generator 60 is disposed on the supporting member 922 in opposing relation to the detection part 54. A musical instrument for which the pedal mechanism 92 is used is not limited to the musical keyboard instrument 100. For example, the pedal mechanism 92 of the same configuration may be used in a freely selected musical instrument, such as a percussion instrument, etc.

It is of note that although FIG. 21 shows the pedal mechanism 92 of the musical keyboard instrument 100, the same configuration as that of FIG. 21 may be adopted for a pedal mechanism for an electric instrument such as an electric string instrument (e.g., an electric guitar). The pedal mechanism used for the electric instrument is an effects pedal operated by a user for adjusting various sound effects such as distortion and compression.

Further, each of the above embodiments describes a configuration in which each of the keys 12 in the musical keyboard instrument 100 is detected. However, an object to be detected by the detection system 20 is not limited to the above example. For example, an instrument operating element operated by a user in playing a wind instrument such as a wood-wind instrument (e.g., a clarinet or a saxophone) or a brass instrument (e.g., a trumpet or a trombone) may be detected by the detection system 20.

As will be understood from the above examples, an object of detection by the detection system 20 is a movable member that is displaced in response to a playing operation. The movable member includes an instrument operating element, such as the keys 12 or the pedal 921, directly operated by a user and also includes a structure such as the hammer 911 that is displaced in conjunction with an operation made to an instrument playing element. However, the movable member according to the present disclosure is not limited to a member that is displaced in response to a playing operation. That is, the movable member should be understood as a displaceable member regardless of how displacement takes place.

(4) In each of the above embodiments, there is shown a configuration in which the musical keyboard instrument 100 has the sound source circuit 34. However, the sound source circuit 34 may be omitted in a configuration in which the musical keyboard instrument 100 has a sound producing mechanism such as the strike mechanism 91, for example. The detection system 20 is used to record how the musical keyboard instrument 100 is played.

As will be understood from the above description, the present disclosure may be specified as an apparatus (instrument playing apparatus) that controls a music sound by outputting to the sound source circuit 34 or the sound producing mechanism an operation signal in accordance with a playing operation. The concept of the instrument playing apparatus includes not only an instrument (the musical keyboard instrument 100) provided with the sound source circuit 34 or the sound producing mechanism as described in each of the above embodiments, but also a device not provided with the sound source circuit 34 or a sound producing mechanism (e.g., a MIDI controller or the pedal mechanism 92 as described above). That is, the instrument playing apparatus according to the present disclosure is expressed as an apparatus operated by an instrument player (or an operator) for playing an instrument.

(5) In each of the embodiments described above, there is shown a configuration in which the coil 61 includes the first portion 611 and the second portion 612, but the coil 61 need not be constituted of two coils. The coil 61 may comprise a single coil (e.g., either the first portion 611 or the second portion 612).

(6) Although each of the above embodiments shows a configuration in which the sound source circuit 34 generates an audio signal V that accords with the position Z of the key 12, the controller 31 may realize a function of the sound source circuit 34 by way of execution of a computer program (e.g., a sound source software) stored in the storage device 32. An element that generates an audio signal V representative of a sound according to the level of the detection signal D (the sound source circuit 34 or the controller 31) is expressed collectively as a "sound controller."

(7) In each of the above embodiments a configuration is described in which the entirety of the adjustment weight 50 is formed from a magnetic material. However, the configuration of the adjustment weight 50 is not limited thereto. For example, the adjustment weight 50 may be formed by disposing a detection part formed from a magnetic or conductive material on a base formed from a resin material or an insulating material such as wood. The detection part may be formed as a single body integral with the base, or may be adhered to the base.

(8) In each of the embodiments described above, the distance between the coil 61 and the detection part changes depending on a playing operation. Alternatively, a size of an area in which the coil 61 and the detection part oppose each other (hereafter, "opposing area") may change depending on a playing operation. Thus, in a configuration according to the present disclosure, the distance or the opposing area between the coil 61 and the detection part changes depending on a playing operation, and the frequency response of the filter changes as a result of the change.

H: Appendix

The following configurations are derivable from the different embodiments described above.

An instrument playing apparatus according to one aspect (first aspect) of the present disclosure has a movable member configured to be displaced according to a playing operation of a user; a detection part formed from a magnetic or conductive body and disposed on the movable member; and a filter that includes a coil and is configured to generate a detection signal from a reference signal, the filter having a frequency response that changes depending on a distance between the detection part and the coil. According to the first aspect, since the frequency response of the filter changes depending on the distance between the detection part and the coil, a detection signal that accords with the distance is generated. That is, a detection signal according to the position of the movable member is generated. In this configuration, since a level of the detection signal changes depending on a frequency response of the filter, it is possible to greatly change a level of the detection signal relative to the displacement of the movable member. Thus, an advantage is obtained in that it is possible to generate a detection signal that highly accurately represents a slight displacement of the movable member.

The "movable member" may be an instrument operating element, such as a key on the musical keyboard instrument or a pedal; or a structure, such as a hammer, that is displaced by an operation performed on the instrument operating element. The "distance between the detection part and the coil" typically may be a shortest distance between the detection part and the coil. Accordingly, the distance between the detection part and the coil can change even in a configuration in which the detection part rotates about a fixed central axis (i.e., a configuration in which the central axis does not move).

In an example (second aspect) of the first aspect, the distance between the detection part and the coil in a central axis direction of the coil changes in accordance with displacement of the movable member. According to the second aspect, it is possible to greatly change a level of the detection signal responsive to displacement of the movable member, as compared with a configuration in which the detection part and the coil move relative to each other within a plane perpendicular to the central axis of the coil (i.e., a configuration in which the distance between the detection part and the coil does not change in the central axis direction of the coil).

In an example (third aspect) of the first aspect or the second aspect, the movable member is an instrument operating element configured to accept the playing operation of the user, and the detection part is an adjustment weight for adjusting a touch feel for the user when the instrument operating element is operated by the user. According to the third aspect, the adjustment weight for adjusting the touch feel for the user when the instrument operating element is operated by the user is also used as the detection part. Therefore, the configuration of the instrument playing apparatus is simplified compared to a configuration in which a separate detection part is provided in addition to the adjustment weight.

In an example (fourth aspect) of any one of the first to the third aspects, the coil includes a first portion and a second portion, and directions of currents flowing through the first portion and the second portion are opposite in sense. According to the fourth aspect, since magnetic fields that are opposite in sense are generated in the first portion and the second portion, it is possible to limit or reduce diffusion of the magnetic field over the surroundings of the coil. Therefore, it is possible to generate a detection signal that highly accurately represents displacement of each of a plurality of respective movable members in a configuration in which a plurality of coils corresponding to the plurality of respective movable members are disposed in close proximity to each other.

In an example (fifth aspect) of the fourth aspect, the detection part opposes both the first portion and the second portion. According to the fifth aspect, since the detection part opposes both the first and second portions of the coil, it is possible to generate a detection signal D that highly accurately represents slight displacements of the movable member, whereby a particularly remarkable effect is attained. It is of note that the detection part need not necessarily oppose both the first and second portions across the entire range of displacement of the movable member. It is sufficient that the detection part opposes the first and second portions in a state in which the movable member is at a specific position (e.g., a position at which the detection part approaches closest to the coil).

In an example (sixth aspect) of any one of the first to fifth aspects, the filter is a low pass filter that reduces, in the reference signal, frequency components above a cut-off frequency, and the cut-off frequency changes depending on the distance between the detection part and the coil.

In an example (seventh aspect) of any one of the first to fifth aspects, the filter is a high pass filter that reduces, in the reference signal, frequency components below a cut-off frequency, and the cut-off frequency changes depending on the distance between the detection part and the coil.

In an example (eighth aspect) of any one of the first to seventh aspects, the filter is a high pass filter that reduces, in the reference signal, frequency components below a cut-off frequency, and the cut-off frequency changes depending on the distance between the detection part and the coil.

In an example (ninth aspect) of the first aspect, the filter is a low pass filter that includes an input to which the reference signal is supplied; an output that outputs the detection signal; a first coil disposed between the input and a coupling point; a second coil disposed between the coupling point and the output; a first capacitive element wired to the coupling point; and a second capacitive element wired to the output, with directions of currents flowing through the first coil and the second coil being opposite in sense. In the configuration according to the ninth aspect, since at least two low pass filters, one including the first coil and the first capacitive element and the other including the second coil and the second capacitive element are wired in series, a low pass filter is realized with a property that the gradient of the gain over frequencies is steep. Therefore, it is easier to allow for a greater change in gain between the closest state and the farthest state. Further, since the direction of a current flowing through the first coil and the direction of a current flowing through the second coil are opposite in sense, magnetic fields are generated in the first and second coils opposite in sense. Therefore, it is possible to limit or reduce diffusion of the magnetic field from the filter to surroundings.

In an example (ninth aspect) of the first aspect, the filter is a high pass filter that includes an input to which the reference signal is supplied; an output that outputs the detection signal; a first capacitive element disposed between the input and a coupling point; a second capacitive element disposed between the coupling point and the output; a first coil wired to the coupling point; and a second coil wired to the output, with directions of currents flowing through the first coil and the second coil being opposite in sense. In the configuration according to the tenth aspect, since at least two high pass filters, one including the first coil and the first capacitive element and the other including the second coil and the second capacitive element are wired in series, a high pass filter is realized with a property that the gradient of the gain over frequencies is steep. Therefore, it is easier to allow for a greater change in gain between the closest state and the farthest state. Further, since the direction of a current flowing through the first coil and the direction of a current flowing through the second coil are opposite in sense, magnetic fields generated in the first and second coils are opposite in sense. Therefore, it is possible to limit or reduce the diffusion of the magnetic field from the filter to the surroundings.

In an example (eleventh aspect) of the ninth aspect or the tenth aspect, the detection part opposes both the first coil and the second coil.

In an example (twelfth aspect) of any one of the first to eleventh aspects, the apparatus further comprise a sound controller configured to generate a sound signal representative of a sound depending on a level of the detection signal. According to the twelfth aspect, since a detection signal is generated that highly accurately represents a slight displacement of the movable member, it is possible to generate an audio signal that represents the slight displacement of the movable member.

In an example (sixth aspect) of any one of the first to fifth aspects, the detection part includes a coil.

DESCRIPTION OF REFERENCE SIGNS

100 . . . musical keyboard instrument (instrument playing apparatus), 10 . . . keyboard, 12 . . . key, 20 . . . detection system, 21 . . . signal processing circuit, 22 . . . supply circuit, 23...output circuit, 30 . . . information processing apparatus, 31 . . . controller, 32 . . . storage device, 33 . . . A/D converter, 34 . . . sound source circuit, 40 . . . sound output device, 50 . . . adjustment weight, 51 . . . rotatable part, 52 . . . load part, 60 . . . signal generator, 61,61A, 61B . . . coil, 62,62A,62B . . . capacitive element, 63,63A, 63B . . . resistive element, 91 . . . strike mechanism, 911 . . . hammer, 912 . . . transmission mechanism, 913 . . . supporting member, 92 . . . pedal mechanism, 921 . . . pedal, 922 . . . supporting member, 923 . . . elastic body.

What is claimed is:

1. An instrument playing apparatus comprising:
    a movable member configured to be displaced responsive to a playing operation of a user;
    a detection part formed from a magnetic or conductive body and disposed on the movable member; and
    a filter that includes a coil and is configured to generate a detection signal from a reference signal, the filter having a frequency response that changes depending on a distance between the detection part and the coil, wherein:
    the filter is a low pass filter that includes:
        an input to which the reference signal is supplied;
        an output that outputs the detection signal;
        the coil including a first coil disposed between the input and a coupling point and a second coil disposed between the coupling point and the output;
        a first capacitive element wired to the coupling point not via the first coil or the second coil; and
        a second capacitive element wired to the output, and directions of currents flowing through the first coil and the second coil are opposite in sense.

2. The instrument playing apparatus according to claim 1, wherein the distance between the detection part and the coil in a central axis direction of the coil changes in accordance with displacement of the movable member.

3. The instrument playing apparatus according to claim 2, wherein:
    the movable member is an instrument operating element configured to accept the playing operation of the user, and
    the detection part is an adjustment weight for adjusting a touch feel of the user when the instrument operating element is operated by the user.

4. The instrument playing apparatus according to claim 3, wherein the detection part opposes both the first coil and the second coil.

5. The instrument playing apparatus according to claim 2, wherein the detection part opposes both the first coil and the second coil.

6. The instrument playing apparatus according to claim 1, wherein:
    the movable member is an instrument operating element configured to accept the playing operation of the user, and
    the detection part is an adjustment weight for adjusting a touch feel of the user when the instrument operating element is operated by the user.

7. The instrument playing apparatus according to claim 6, wherein the detection part opposes both the first coil and the second coil.

8. The instrument playing apparatus according to claim 1, wherein the detection part opposes both the first coil and the second coil.

9. The instrument playing apparatus according to claim 1, wherein:
    the low pass filter reduces, in the reference signal, frequency components above a cut-off frequency, and
    the cut-off frequency changes depending on the distance between the detection part and the coil.

10. The instrument playing apparatus according to claim 1, the apparatus further comprising a sound controller configured to generate a sound signal representative of a sound depending on a level of the detection signal.

11. The instrument playing apparatus according to claim 1, wherein the detection part includes a coil.

\* \* \* \* \*